(12) United States Patent
Fukagawa et al.

(10) Patent No.: US 7,034,437 B2
(45) Date of Patent: Apr. 25, 2006

(54) PIEZO ACTUATOR DRIVE CIRCUIT

(75) Inventors: Yasuhiro Fukagawa, Obu (JP);
Yasuyuki Sakakibara, Nishio (JP); Eiji Takemoto, Obu (JP)

(73) Assignee: DENSO Corporation, Kariya (JP)

( * ) Notice: Subject to any disclaimer, the term of this patent is extended or adjusted under 35 U.S.C. 154(b) by 69 days.

(21) Appl. No.: 10/780,697

(22) Filed: Feb. 19, 2004

(65) Prior Publication Data

US 2004/0169436 A1 Sep. 2, 2004

(30) Foreign Application Priority Data

Feb. 27, 2003 (JP) ............................. 2003-051790
Dec. 9, 2003 (JP) ............................. 2003-410907

(51) Int. Cl.
*H01L 41/08* (2006.01)
(52) U.S. Cl. .................. 310/316.03; 310/317; 310/319
(58) Field of Classification Search ........... 310/316.01, 310/316.03
See application file for complete search history.

(56) References Cited

U.S. PATENT DOCUMENTS 4,887,569 A * 12/1989 Igashira et al. ............ 123/300

| | | | |
|---|---|---|---|
| 6,236,190 B1 | 5/2001 | Hoffmann et al. | |
| 6,366,868 B1 * | 4/2002 | Freudenberg et al. | ........ 702/115 |
| 6,472,796 B1 * | 10/2002 | Hoffmann et al. | ..... 310/316.03 |
| 6,498,418 B1 * | 12/2002 | Rueger | .................. 310/316.03 |
| 6,563,252 B1 * | 5/2003 | Schrod | .................. 310/316.03 |
| 6,705,291 B1 * | 3/2004 | Rueger et al. | .............. 123/467 |

FOREIGN PATENT DOCUMENTS

JP 2002-136156 5/2002

* cited by examiner

*Primary Examiner*—Mark Budd
(74) *Attorney, Agent, or Firm*—Nixon & Vanderhye

(57) ABSTRACT

A piezo actuator drive circuit comprises a charging path for charging a piezo stack that can be driven by being charged and discharged, an arithmetic circuit for calculating the charging amount for the piezo stack, and a driving control circuit for comparing the calculated charging amount and a target charging amount and correcting the charging amount during the next charging process according to the difference between the compared charging amounts. A charging current flowing through the piezo stack and a charging voltage applied to it may be measured during a charging process. It is preferable that the calculated charging amount be the amount of energy that is the result of the time quadrature of the product of the measured current and voltage.

12 Claims, 10 Drawing Sheets

PIEZO ACTUATOR DRIVE CIRCUIT

CROSS REFERENCE TO RELATED APPLICATION

This application is based on and incorporates herein by reference Japanese Patent Applications No. 2003-51790 filed on Feb. 27, 2003 and No. 2003-410907 filed Dec. 9, 2003.

FIELD OF THE INVENTION

The present invention relates to a piezo actuator drive circuit.

BACKGROUND OF THE INVENTION

A piezo actuator utilizes the piezoelectric effect of PZT or another piezoelectric material and has a piezo stack, which is a capacitive element. When the piezo stack is electrically charged or discharged, it expands or contracts, linearly moving a piston or the like. For example, in fuel injection systems for internal combustion engines, piezo actuators switch ON-OFF valves of fuel injectors.

A piezo actuator has a temperature characteristic, in which the capacitance of its piezo stack changes with temperature. The amount of displacement of the piezo actuator based on the expansion, contraction or displacement of the piezo stack also changes with temperature. It is known that this temperature characteristic is compensated if the energy supplied to the piezo stack by a piezo actuator drive circuit is kept constant.

JP-A-2002-136156 (U.S. Pat. No. 6,230,190) discloses a piezo actuator drive circuit that makes use of this to drive a piezo actuator. In this publication, it is proposed to control a piezo stack with constant energy. This method was proposed as a driving method for compensating for the temperature characteristic of the amount of displacement of a piezo actuator. FIG. 10 shows the circuit for driving the piezo actuator for one cylinder of an internal combustion engine by this proposed method. FIGS. 11A, 11B and 11C show the charging control for the piezo stack in the drive circuit comparatively in a case where the capacitance of the piezo stack varies due to its temperature characteristic. In FIGS. 11A, 11B and 11C, the capacitances C of the piezo stack are 6, 8 and 10 microfarads ($\mu F$), respectively.

With reference to FIG. 10, the piezo actuator drive circuit includes a first current-carrying path and a second current-carrying path. The first current-carrying path carries electric current from a DC power supply 11 through a switching device 14 and an inductor 16 to a piezo stack 7. The second current-carrying path bypasses the power supply 11 and the switching device 14 and carries electric current through the inductor 16 to the piezo stack 7. While the switching device 14 is ON, a gradually increasing charging current flows through the first current-carrying path. While the switching device 14 is OFF, a gradually decreasing charging current flows through the second current-carrying path due to the flywheel effect. If the switching device 14 is repetitively turned on and off, the charging current repeats a gradual increase and decrease, as shown in FIG. 11A. This increases the amount of charge on the piezo stack 7, so that the voltage Vp across the piezo stack 7 rises step by step.

Specifically, it is necessary in advance to find the ON periods for which the switching device 14 is ON so that the piezo stack 7 can be charged with a desired amount of energy E when its capacitance C is the central value of 8 $\mu F$.

While the piezo stack 7 is charged, its capacitance C may increase from the central value of 8 $\mu F$ (FIG. 11B) to 10 $\mu F$ (FIG. 11C). The capacitance increase suppresses the speed at which the voltage across the piezo stack 7 rises. The speed suppression suppresses the speed at which the voltage applied to the inductor 16 drops.

Accordingly, the speed at which the charging current I decreases on the whole is suppressed in comparison with that for the central value of 8 $\mu F$. This increases the speed at which the piezo stack 7 is charged. Consequently, even if the capacitance of the piezo stack 7 increases, the speed at which the voltage Vp across it rises is not greatly suppressed. Even if this capacitance C increases, the speed at which the charging current decreases on the whole is not greatly suppressed.

The suppression of the speed at which the voltage across the piezo stack 7 rises decreases the speed at which the stack 7 is supplied with energy. The suppression of the speed at which the charging current I decreases raises the speed at which the piezo stack 7 is supplied with energy. Consequently, these cancel each other, so that the time profile of the supplied energy is roughly constant regardless of the increase of the capacitance of the piezo stack 7 (FIGS. 11B and 11C).

The capacitance C of the piezo stack 7 may decrease from the central value of 8 $\mu F$ (FIG. 11B) to 6 $\mu F$ (FIG. 11A). Because the ON periods, when the switching device 14 is ON, are constant, the capacitance decrease increases the speed at which the voltage Vp across the piezo stack 7 rises. The speed increase makes higher the speed at which the voltage applied to the inductor 16 drops. Accordingly, the speed at which the charging current decreases on the whole is higher in comparison with that for the central value of 8 $\mu F$. This decreases the speed at which the piezo stack 7 is charged. Consequently, even if the capacitance of the piezo stack 7 decreases, the speed at which the voltage across it rises is not very high. Even if this capacitance decreases, the speed at which the charging current decreases on the whole is not very high either. The increase of the speed at which the voltage across the piezo stack 7 rises increases the speed at which the piezo stack is supplied with energy. The increase of the speed at which the charging current decreases lowers the speed at which the piezo stack 7 is supplied with energy. Consequently, these cancel each other, so that the time profile of the supplied energy is roughly constant regardless of the decrease of the capacitance of the piezo stack 7 (FIGS. 11A and 11B).

In this way, by making constant the time when the switching device 14 is ON, it is possible to suitably control the energy supplied to the piezo stack 7, by means of an open loop without controlling the charging of the piezo stack by detecting the variation of its capacitance.

However, piezo stacks vary in capacitance, and each of them changes in capacitance with temperature. Each piezo stack tends to change differently in capacitance with temperature. Therefore, a representative capacitance, which is roughly the central value, is sought and determined statistically in advance in consideration of the individual differences and the actually operating or working temperature. The representative capacitance is the basis for determining (storing in an ECU) the ON periods when the switching device 14 is ON so that the piezo stack 7 can be charged with the desired amount of energy. The ON periods are kept constant uniformly regardless of the temperature and the individual differences. Open control is carried out to charge the piezo stack 7 with the desired amount of energy.

For this reason, it is difficult to completely remove the error of constant energy supply quantity due to the variation among piezo stacks 7. For example, in view of the request for exhaust gas cleanup or purification in recent years, it is important that the valve switching timing of fuel injectors coincide, and it has been demanded to improve the precision with which each piezo stack is charged with a predetermined amount of energy within a predetermined time. In the conventional art, the open loop control based on the predetermined ON periods is adopted. Accordingly, it has been difficult to obtain a constant amount of displacement if the amounts of energy with which the piezo stacks are charged for the constant amount of displacement vary due to the variation among the piezo stacks.

SUMMARY OF THE INVENTION

In consideration of these circumstances, the present invention has an object to provide a piezo actuator drive circuit that can control piezo stacks with high precision regardless of the variation among the piezo stacks, etc.

According to the present invention, a piezo stack that can be driven by charging and discharging is charged in a charging amount for a predetermined charging period. The charging amount is calculated. The calculated amount and a target charging amount are compared. The charging amount during the next charging process is corrected according to the difference between the compared amounts. Thus, the charging amount in which the piezo stack is charged for the preset constant charging time and the target charging amount, which may depend on the variation among piezo stacks, are compared. The charging amount is corrected according to the difference between the compared amounts during the next charging process. Accordingly, the charging amount in which the piezo stack is charged can be controlled accurately without being influenced by the variation among piezo stacks, etc.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

First Embodiment

Figure 1:
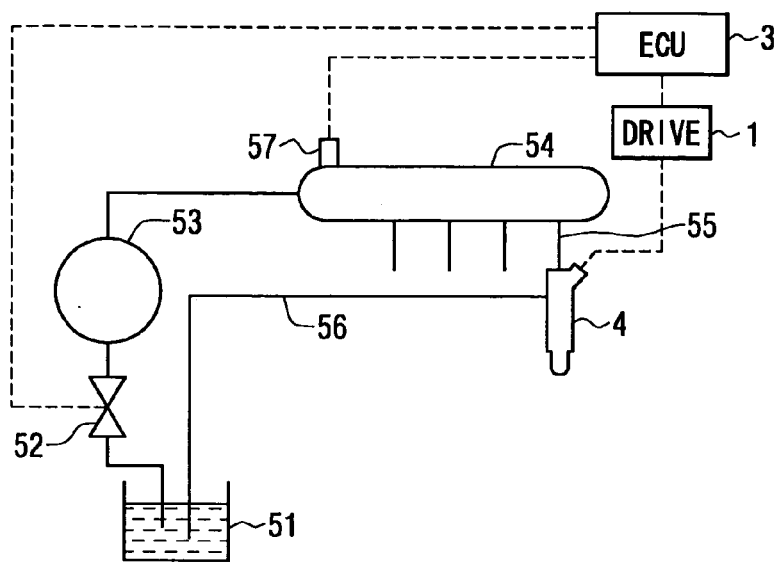
FIG. 1 is a schematic diagram of a fuel injection system of an internal combustion engine fitted with a piezo actuator to which the present invention is applied.
Figure 3:
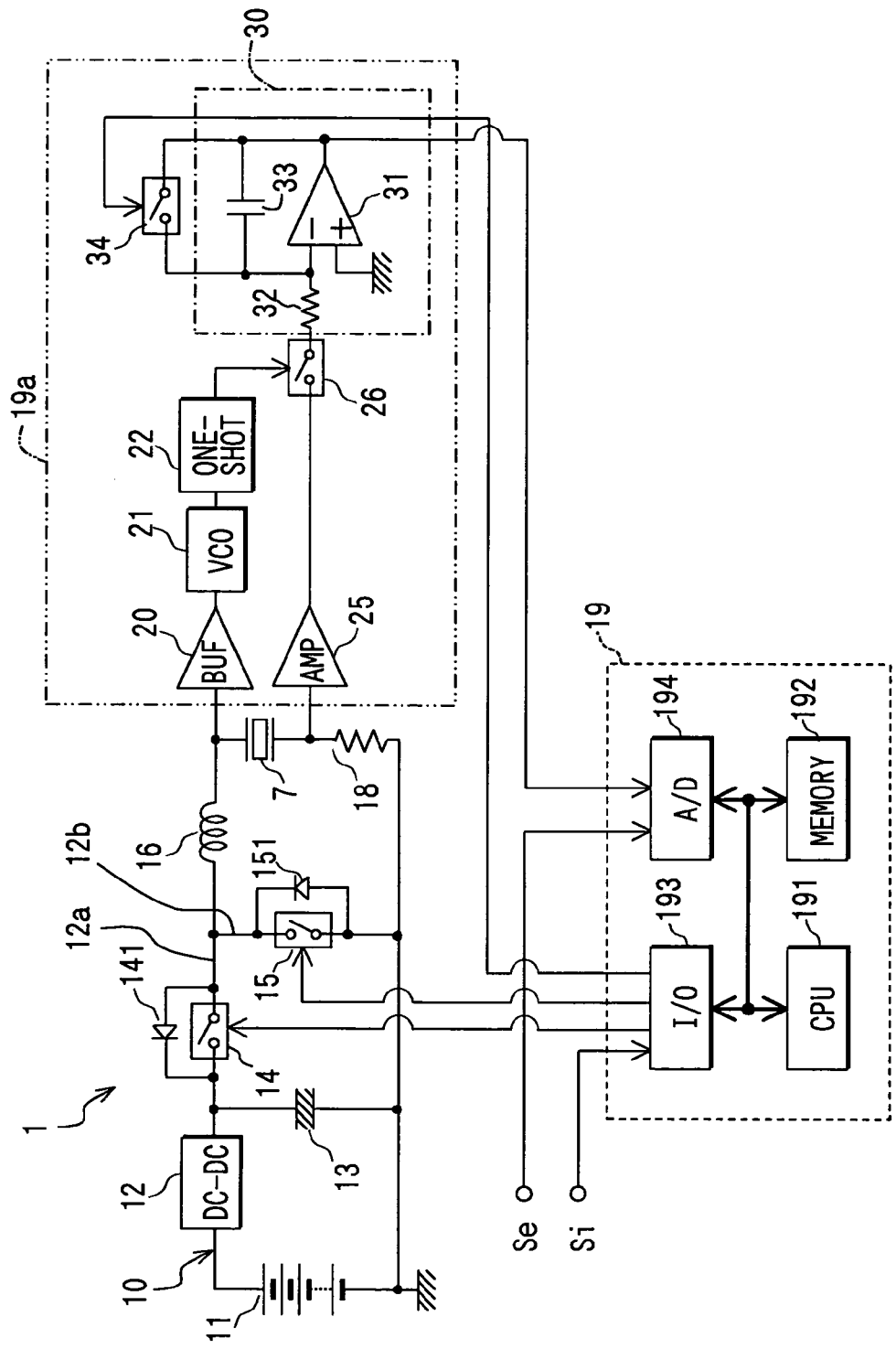
FIG. 3 is an electric circuit diagram of a piezo actuator drive circuit according to a first embodiment of the present invention.

Referring to FIG. 1, a fuel injection system for a common-rail four-cylinder diesel engine, which may be a four-cylinder engine, is shown. The fuel injection system includes a piezo actuator drive circuit 1, which is a multiple switching circuit constructed as shown in FIG. 3.

The diesel engine has fuel injectors 4, only one of which is shown, and each of which is fitted to one of the engine cylinders. The injectors 4 are supplied with fuel from a common rail 54, each through a supply line 55. The injectors 4 can inject fuel into the combustion chambers of the respective cylinders with an injection pressure roughly equal to the common rail pressure, which is the fuel pressure in the common rail 54. The common rail 54 is supplied with fuel under pressure from a fuel tank 51 by a high pressure supply pump 53 and stores it under high pressure. A part of the fuel supplied to each injector 4 can be injected into the associated combustion chamber. The other part of the supplied fuel can be used as the hydraulic oil for controlling the injector 4 and circulate from the injector 4 through a low pressure drain line 56 into the fuel tank 51.

The common rail 54 is fitted with a pressure sensor 57 as a pressure sensing means, which senses the common rail pressure. On the basis of the sensed pressure, an engine ECU 3 controls a quantity regulating valve 52 to regulate the amount of fuel supplied under pressure to the common rail 54. The ECU 3 so controls the common rail pressure that this pressure can be a proper injection pressure under the operating conditions detected with the data input from other sensors. On the basis of the crankshaft angle and other detection signals, the ECU 3 computes fuel injection timing and quantity. According to the computed timing and quantity, the ECU 3 switches the ON-OFF valves of the injectors 4 so that the injectors 4 can inject fuel for predetermined periods of time. The piezo actuator drive circuit 1 controls the magnitude of the charging current of a driving control circuit 19 (FIG. 3) during a charging process according to a target charging amount.

Figure 2:
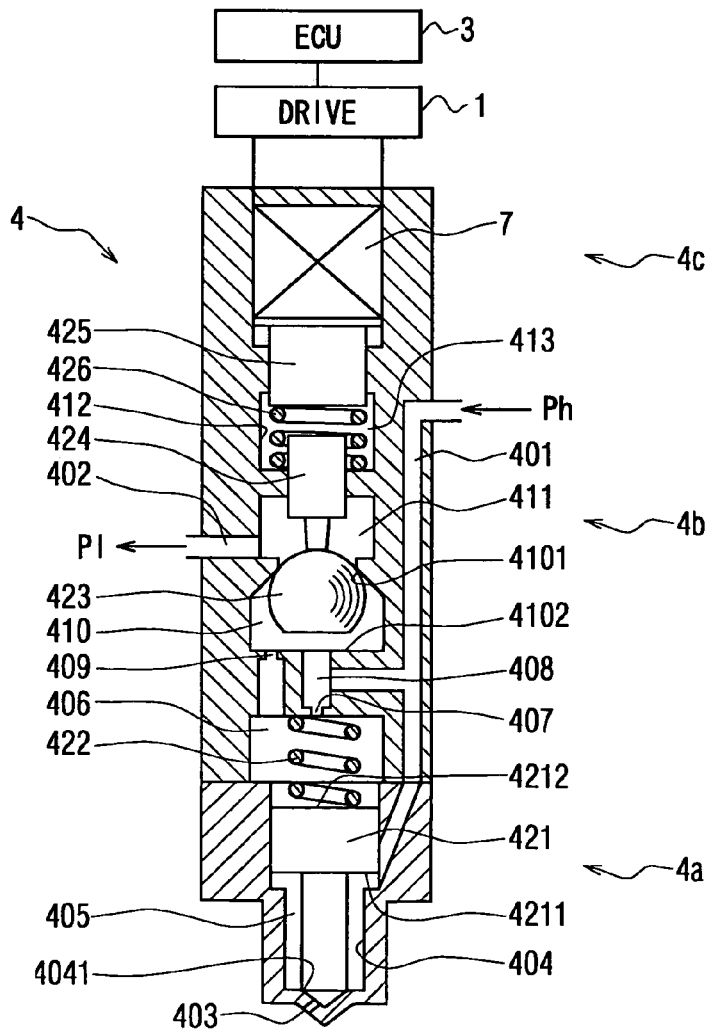
FIG. 2 is a sectional view of the fuel injector including the piezo actuator shown in FIG. 1.

As shown in FIG. 2, each fuel injector 4 roughly takes the form of a bar, rod or stem. A lower portion of the injector 4 extends through the wall of the associated combustion chamber (not shown) and protrudes into this chamber. The injector 4 includes a nozzle 4a, a back pressure controller 4b and a piezo actuator 4c. The nozzle 4a and piezo actuator 4c are a lower part and an upper part, respectively, of the injector 4. The pressure controller 4b is positioned between the parts 4a and 4c.

The nozzle 4a has a main body 404 and a needle 421. The main body 404 has an annular seat 4041 formed at its bottom and a nozzle hole 403 formed through its bottom inside the seat. The head of the needle 421 is held slidably in the main body 404. The needle 421 can be seated on the annular seat 4041. The space 405 around the lower part of the needle 421 is supplied with high pressure fuel from the common rail 54 through a high pressure passage 401. When the needle 421 is lifted from the annular seat 4041, fuel is injected from the space 405 through the nozzle hole 403. The pressure of the fuel supplied through the high pressure passage 401 acts upward on the annular lower surface 4211 of the needle head.

The nozzle 4a has a back pressure chamber 406 formed on the upper side of the needle 421. The back pressure chamber 406 is supplied with fuel as control fluid through the high pressure passage 401 and an inlet orifice 407 so that a back pressure can develop in this chamber. The back pressure chamber 406 is fitted with a spring 422. The back pressure acts together with the compressive force of the spring 422 downward on the top 4212 of the needle 421. The back pressure can be switched by the back pressure controller 4b.

The back pressure controller 4b can be driven by the piezo actuator 4c, which has a piezo stack 7. The pressure controller 4b has a valve chamber 410 and a low pressure chamber 411 both formed in it. The valve chamber 410 communicates through an outlet orifice 409 with the back pressure chamber 406. The valve chamber 410 has a conical ceiling 4101 as a valve seat on the low-pressure side, which tapers upward and is open at its top. The valve chamber 410 communicates through its ceiling top with the low pressure chamber 411. The low pressure chamber 411 communicates with a low pressure passage 402, which is connected with the associated drain line 56. The valve chamber 410 has a bottom 4102 as a valve seat on the high-pressure side and communicates through it with a high pressure control passage 408, which branches off from the high pressure passage 401. The valve chamber 410 is fitted with a ball 423 having a horizontally-cut flat bottom.

The ball 423 is a vertically movable valve body. When the ball 423 moves down, its flat bottom will be seated on the valve seat 4102 to isolate the valve chamber 410 from the control passage 408. This makes the back pressure chamber 406 communicate through the outlet orifice 409 and valve chamber 410 with the low pressure chamber 411. Consequently, the back pressure on the nozzle needle 421 decreases, so that the needle is lifted. When the ball 423 moves up, it will be seated on the valve seat 4101 to isolate the valve chamber 410 from the low pressure chamber 411. This isolates the back pressure chamber 406 from the low pressure chamber 411, so that the back pressure chamber 406 communicates with the high pressure passage 401 only. Consequently, the back pressure on the nozzle needle 421 increases, so that the needle is seated. The ball 423 can be driven by the piezo actuator 4c.

The piezo actuator 4c has an axial bore 412 formed in it above the low pressure chamber 411. The piezo actuator 4c also has an upper piston 425 and a lower piston 424, which is smaller in diameter than the upper piston. The pistons 424 and 425 are held slidably in the axial bore 412. The upper piston 425 is positioned under the piezo stack 7, which can vertically expand and contract.

The axial bore 412 is fitted with a spring 426, which forces the upper piston 425 upward into contact with the piezo stack 7. This piston 425 can be vertically displaced in the same amount as the piezo stack 7 expands or contracts. The bottom of the lower piston 424 faces the top of the ball 423.

The pistons 424 and 425 and the axial bore 412 define a displacement enlarging chamber 413, which is filled with fuel. When the piezo stack 7 expands, the upper piston 425 is displaced downward. This compresses the fuel in the displacement enlarging chamber 413, and the compressive force is transmitted through the fuel to the lower piston 424. Because the lower piston 424 is smaller in diameter than the upper piston 425, the amount in which the piezo stack 7 has expanded is enlarged. The enlarged amount of expansion is converted into an amount of displacement of the lower piston 424.

The displacement enlarging chamber 413 communicates with the low pressure passage 402 through a check valve (not shown) so as to be filled constantly with a sufficient amount of fuel. The forward direction of the check valve is from the low pressure passage 402 to the displacement enlarging chamber 413. When the expansion of the piezo stack 7 pushes the upper piston 425, the check valve closes to confine fuel in the displacement enlarging chamber 413.

The fuel injection from the injector 4 involves charging the piezo stack 7. The charged stack 7 expands, thereby moving the lower piston 424 downward. This moves the ball 423 away from the valve seat 4101 on the low-pressure side Pl and seats it on the valve seat 4102 on the high-pressure side Ph. Consequently, the back pressure chamber 406 communicates with the low pressure passage 402, so that the fuel pressure in this chamber decreases. As a result, the upward force acting on the nozzle needle 421 prevails over the downward force acting on it. This lifts the nozzle needle 421 from the annular seat 4041, thereby starting fuel injection.

Stopping the injection involves discharging the piezo stack 7. The discharged stack 7 contracts, thereby releasing the ball 423 from the downward force exerted on it. When the injector 4 injects fuel, the pressure in the valve chamber 410 is low. The high pressure of the fuel supplied through the control passage 408 acts on the bottom of the ball 423. Accordingly, an upward fuel pressure acts on the ball 423. The release of the ball 423 from the downward force lifts the ball from the valve seat 4102 on the high-pressure side and seats it back on the valve seat 4101 on the low-pressure side. This increases the fuel pressure in the valve chamber 410, thereby seating the nozzle needle 421, so that the injection stops.

As shown in FIG. 3, the piezo actuator drive circuit 1 includes a DC power supply 10, which includes the vehicle battery 11, a DC-DC converter 12 and a buffer capacitor 13. The power supply 10 outputs voltage for charging the piezo stack 7. The DC-DC converter 12 generates tens through hundreds of volts of DC voltage Vdc from the vehicle battery 11. The out put terminal of the DC-DC converter 12 is connected to the buffer capacitor 13. The buffer capacitor 13 has a relatively large capacitance and maintains a roughly constant voltage even while the piezo stack 7 is charged. The piezo stacks 7 for the other three engine cylinders are substantially identical with the piezo stack 7 shown in FIG. 2. Each of these three piezo stacks 7 is fitted in one of the other three injectors 4.

The piezo actuator drive circuit 1 also includes a first current-carrying path 12a, which carries an electric current from the buffer capacitor 13 of the DC power supply 10 through an inductor 16 to the piezo stack 7. The first current-carrying path 12a has a first switching device 14, which is connected in series between the buffer capacitor 13 and the inductor 16. The first switching device 14 is a MOSFET, the parasitic diode 141 of which is connected for reverse bias against the voltage across the buffer capacitor 13.

The inductor 16 and piezo stack 7 form a second current-carrying path 12b, which bypasses the DC power supply 10 and first current-carrying path 12a. The second current-carrying path 12b has a second switching device 15, which is connected to a junction between the inductor 16 and first switching device 14. The second switching device 15 is also a MOSFET, the parasitic diode 151 of which is connected for reverse bias to the voltage across the buffer capacitor 13.

The current-carrying paths 12a and 12b are common to the piezo stacks 7 of the four injectors 4 as driven devices and can select one of the piezo stacks 7.

The first switching device 14, the inductor 16, the piezo stack 7 and a current sensing resistor 18 are connected in series, forming a charging circuit. The second switching device 15, the inductor 16, the piezo stack 7 and the current sensing resistor 18 are connected in series, forming a discharging circuit.

A driving control circuit 19 outputs pulsed control signals to the gates of the switching devices 14 and 15. The control signals turn on or off the switching devices 14 and 15 to control the charging and discharging of the piezo stack 7.

The ECU 3 (FIGS. 1 and 2) controls the whole injection system and outputs binary injection signals as driving signals to the driving control circuit 19. The injection signals are 1 for approximate fuel injection periods.

A buffer circuit 20 is connected with a junction between the piezo stack 7 and the inductor 16, which is connected with one terminal of the stack. The buffer circuit 20 is provided to receive, with a relatively high impedance, the voltage applied to the piezo stack 7. The buffer circuit 20 outputs the applied voltage substantially without decreasing the energy supplied to the piezo stack 7. The output terminal of the buffer circuit 20 is connected with a VCO circuit 21 as a voltage-controlled oscillator, which outputs a predetermined frequency proportional to the output from the buffer circuit 20. The output terminal of the VCO circuit 21 is connected with a one-shot circuit 22. At the rises of the signal from the VCO circuit 21, the one-shot circuit 22 outputs pulses constant in width.

An amplifier circuit 25 is connected with a junction between the piezo stack 7 and the current sensing resistor 18, which is connected with the other terminal of the piezo stack. The amplifier circuit 25 amplifies the signal sensed by the sensing resistor 18 to a predetermined level. The amplifier circuit 25 is connected through a switching circuit 26 as a third switching device with an integrating circuit 30. The switching circuit 26 may also be a MOSFET. The pulses from the one-shot circuit 22 are input to the gate of the third switching device 26 to turn on or off this switching device in response to the input pulses.

The integrating circuit 30 includes an operational amplifier 31, an integrating resistor 32 and an integrating capacitor 33. The inverting input terminal (−) of the operational amplifier 31 is connected with the integrating resistor 32. While the third switching device 26 is ON, the signal from the amplifier circuit 25 is input to the inverting input terminal (−). The noninverting input terminal (+) of the operational amplifier 31 is grounded. The integrating capacitor 33 is connected between the inverting input terminal (−) and output terminal of the operational amplifier 31. The integrating capacitor 33 is connected in parallel with a switching circuit 34 as a fourth switching device, which is turned on or off in response to the signal from the driving control circuit 19. While the fourth switching device 34 is ON, it short-circuits the integrating capacitor 33 to reset the integrated value.

The output terminal of the operational amplifier 31 is connected with the driving control circuit 19, which includes a CPU 191, a memory 192, an I/O circuit 193 and an A/D converter circuit 194. The CPU 191 computes and processes data etc. according to a predetermined program. The memory 192 stores the program and data. Signals can be input to and output from the I/O circuit 193. The A/D converter circuit 194 converts the analog signals sensed by various sensing means into digital signals. With injection signals Si as driving signals input to the I/O circuit 193, it outputs control signals to the gates of the switching devices 14 and 15 and a reset signal to the fourth switching device 34 of the integrating circuit 30. The voltage of an energy control signal Se representing the target charging amount (the target energy with which the piezo stack 7 is charged) and the voltage output from the integrating circuit 30 are input to the A/D converter circuit 194.

The target charging amount (the target energy with which the piezo stack 7 is charged) may be a value measured in advance experimentally or otherwise on the basis of the central value of either the variations among piezo stacks (piezo actuators) or the temperature characteristics of piezo stacks. The energy control signal Se, which represents the target charging amount, is input from the outside to the driving control circuit 19 through the A/D converter circuit 194.

The buffer circuit 20, VCO circuit 21, one-shot circuit 22, amplifier circuit 25, switching devices 26 and 34, and integrating circuit 30 form an arithmetic or operational circuit 19a.

Figure 5:
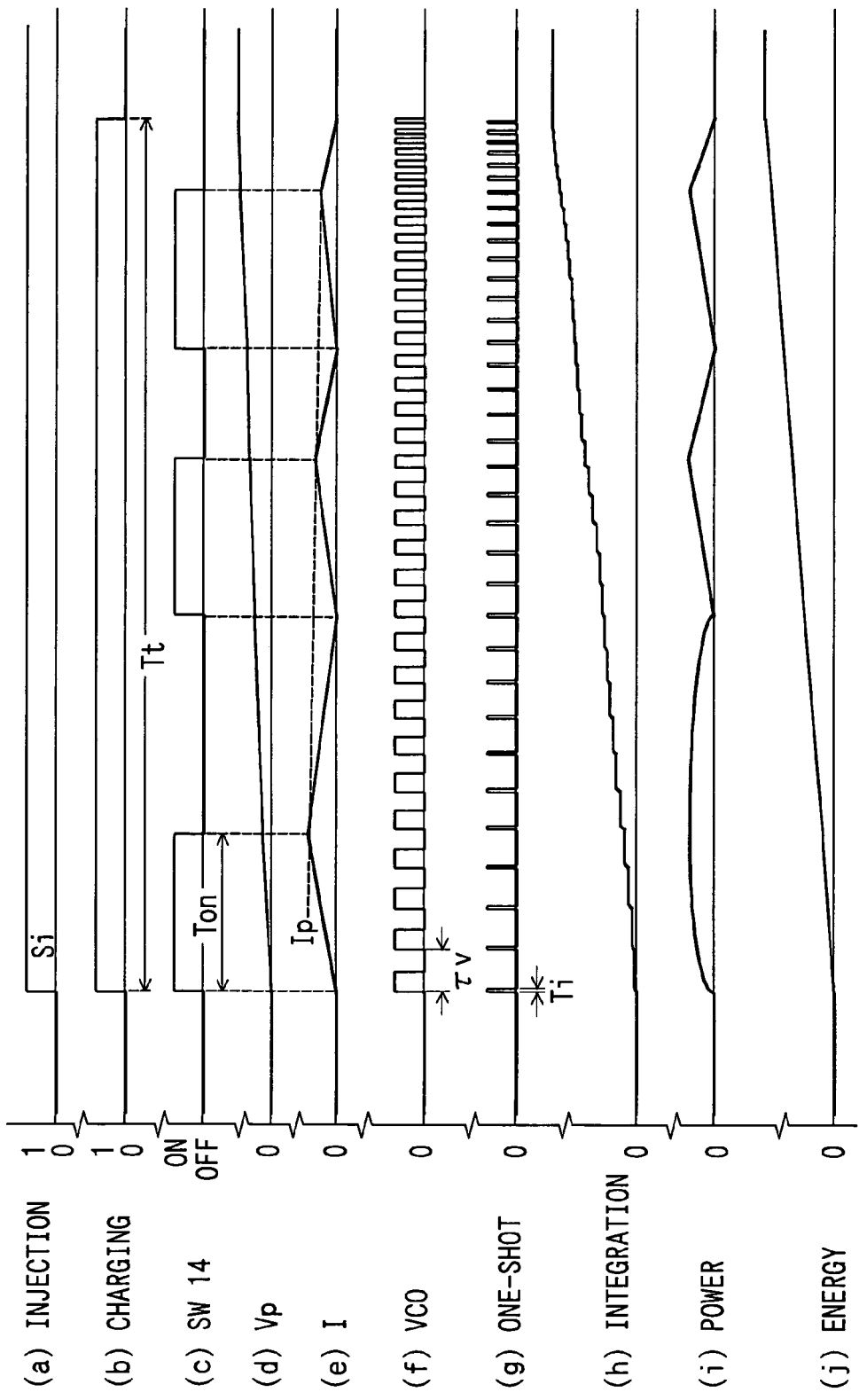
FIG. 5 is a time chart showing the operation of various parts of the piezo actuator drive circuit according to the first embodiment.

The driving control circuit 19 will be described below around the circuitry for charging the piezo stack 7. The control circuit 19 sets the ON and OFF periods when the first switching device 14 is turned on and off, respectively, in the following way and outputs a control signal to it. The ON periods are set at a constant value Ton (FIG. 5). The OFF periods are so set that, when the charging current becomes 0, each of them ends and is followed by an ON period, with the first switching device 14 turned on. The constant value Ton can be adjusted by the control circuit 19. The control circuit 19 compares the energy ((h) in FIG. 5) calculated during a control process, which will be described later on, with the target charging amount (the energy control signal Se in FIG. 3). The control circuit 19 determines a controlled variable for correcting the charging amount during the next charging process according to the difference between the calculated energy and the target charging amount. The control signal for the first switching device 14 is output for a time predetermined by means of timer control. As a result, the first switching device 14 is turned on and off repeatedly the number of times according to the predetermined time during a preset charging period (FIG. 5). The time chart of FIG. 5 shows:

(a) an injection signal Si as a driving signal;
(b) a charging time Tt;
(c) the ON-OFF characteristic of the first switching device 14;
(d) the charging voltage Vp applied to the piezo stack 7;
(e) the charging current flowing through the piezo stack 7;
(f) the output characteristic of the VCO circuit 21;
(g) pulses output from the one-shot circuit 22;
(h) the output characteristic of the integrating circuit 30;
(i) the charging power of the piezo stack 7; and (j) the transient characteristic of the energy with which the piezo stack 7 is charged.

The charging power (i) and transient characteristic (j) were measured by an oscilloscope or another instrument. Ton represents the ON periods of the ON-OFF characteristic (c). Ip represents the peak value of the charging current (e) during one ON-OFF cycle. τv represents the period of a frequency proportional to the charging voltage of the output characteristic of the VCO circuit 21 (f). Ti represents the width of the output pulses (g) of the one-shot circuit 22.

The charging time Tt is stored in the memory 192 of the driving control circuit 19. The charging time Tt is a time predetermined on the basis of the target charging amount. It is preferable that the time Tt be the optimum time determined according to the amount of fuel injected from the injector 4 and/or another required fuel injection characteristic.

As seen from the change of charging current with time (e) in FIG. 5, while the first switching device 14 is ON, a gradually increasing charging current I flows from the buffer capacitor 13 through the inductor 16 and piezo stack 7 of the first current-carrying path 12*a*. As also seen, while the first switching device 14 is OFF, the electromotive force induced in the inductor 16 has a forward bias for the second parasitic diode 151, so that a gradually decreasing charging current flows through the second current-carrying path 12*b* due to the flywheel effect. The resonance frequency of the circuit including the inductor 16 and piezo stack 7 is sufficiently high in comparison with the ON-OFF frequency of the first switching device 14. The current waveform can be regarded as triangular. The peak current (the peak value of charging current) Ip during one ON-OFF cycle is the current at the end of the ON period of this cycle and can be expressed as follows:

$$Ip=(Vdc-Vp)\times Ton/L$$

where Vdc represents the voltage output from the DC power supply 10, which is the voltage across the buffer capacitor 13;
Vp represents the piezo stack voltage;
Ton represents the length of the ON periods;
L represents the inductance of the inductor 16.

As stated above, the voltage Vdc output from the power supply 10 can be regarded as constant.

As seen from the voltage characteristic (d), current characteristic (e) and energy characteristic (j) in FIG. 5, the piezo stack voltage Vp exhibits such a time-varying profile that its initial value at the time when the piezo stack 7 starts to be charged is 0, and that it increases gradually with time. Accordingly, the voltage (Vdc−Vp) applied to the inductor 16 while the switching device 14 is ON decreases gradually as the piezo stack 7 is charged more. Consequently, the electromotive force induced in the inductor 16 decreases gradually, so that the gradient of the charging current during the ON period decreases as the piezo stack 7 is charged more. In this embodiment, because the ON period Ton are constant, the charging current exhibits such a time-varying profile that it is triangular in waveform and decreases, on the whole, in contrast to the piezo stack voltage Vp.

Because the piezo stack voltage Vp is inversely proportional to the capacitance of the piezo stack 7, an increase in the capacitance suppresses the speed at which the piezo stack charging voltage Vp rises. The speed suppression moderates the drop in the voltage applied to the inductor 16 while the switching device 14 is ON. As a result, the speed at which the charging current Ip decreases on the whole is suppressed. This increases the speed at which the piezo stack 7 is supplied with charge. Namely, this increases the speed at which the piezo stack charging voltage Vp rises. Consequently, even if the capacitance of the piezo stack 7 increases with temperature etc., the time-varying profile of the piezo stack voltage Vp does not greatly change. Because the capacitance increase does not greatly change the piezo stack voltage Vp, the time-varying profile of the charging current does not greatly change.

The small influence of the increase in the capacitance C of the piezo stack 7 on the piezo stack voltage Vp and the charging current I has the following property. The amount of energy with which the piezo stack 7 is supplied per unit time by being charged is expressed as the product of the piezo stack charging voltage Vp and the charging current I. The suppression of the speed at which the piezo stack charging voltage Vp rises decreases the amount of energy supplied per unit time. The moderation of the decrease in the charging current I increases the amount of energy supplied per unit time. As a result, the suppression and the moderation serve to cancel each other. Consequently, the amount of energy supplied per unit is roughly constant even if the capacitance C of the piezo stack 7 changes with ambient temperature etc.

As shown in FIG. 3, this embodiment includes an arithmetic or operational means for calculating the energy with which the piezo stack 7 is charged for the charging time Tt predetermined by the arithmetic circuit 19*a*. As also shown, the embodiment also includes a driving control means for comparing the target charging amount and the energy calculated by the arithmetic circuit 19*a*, and for correcting the energy with which the piezo stack 7 is charged for the next time.

The driving control means compares the target charging amount and the amount of energy with which the piezo stack 7 has been charged for a preset constant charging time. During the next charging process, the driving control means makes a correction according to the difference between the compared amounts. This makes it possible to reduce the influence of the variation among the piezo stacks 7 and/or other influence so that the amount of energy with which the piezo stack 7 is charged can be controlled with accuracy.

The driving control means is included in the piezo actuator drive circuit 1 or the driving control circuit 19. Alternatively, the driving control means might be included the ECU 3, which controls the whole fuel injection system. In this embodiment, the driving control means will be described hereinafter as included in the drive circuit 1.

Figure 4:
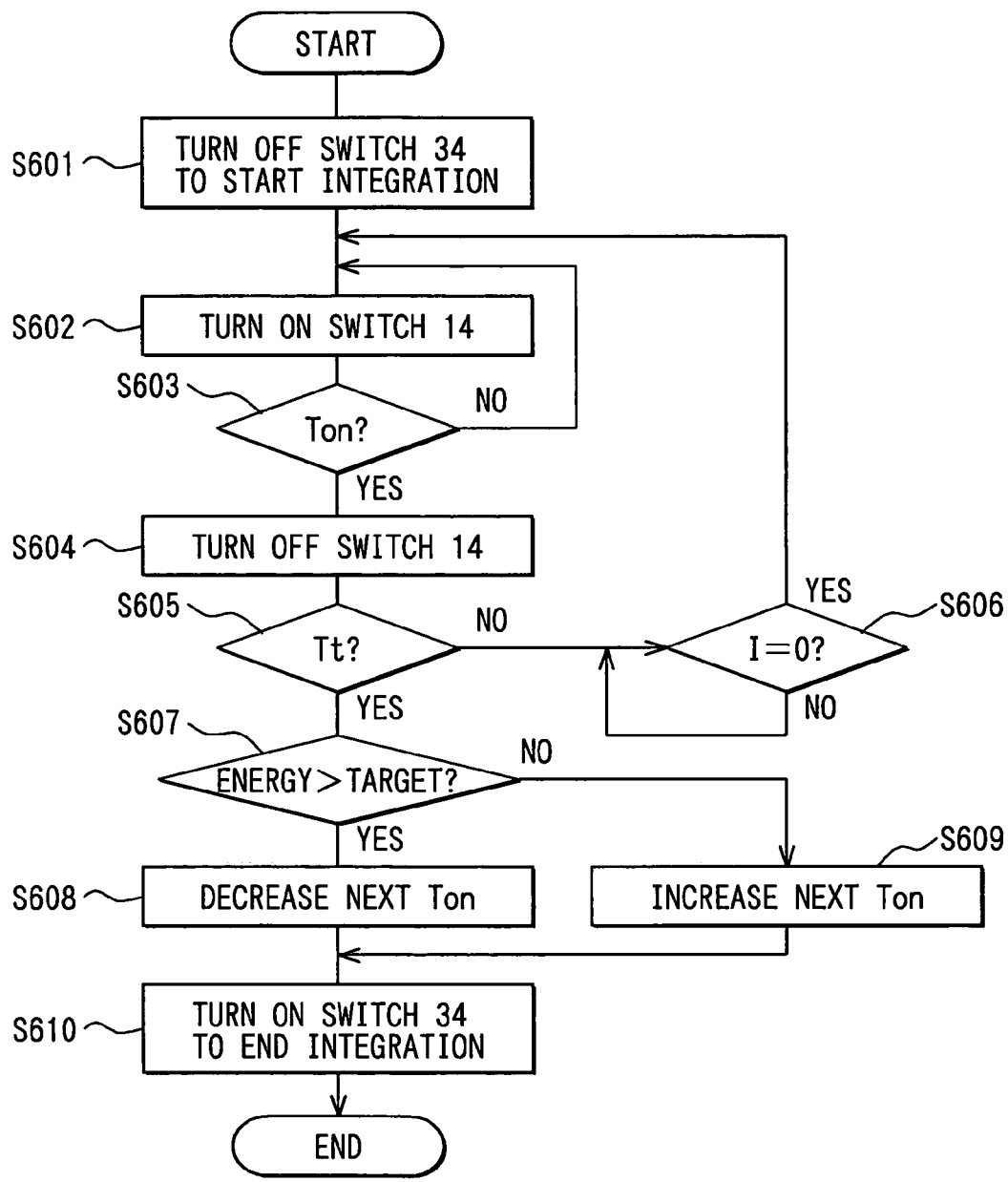
FIG. 4 is a flow chart showing the control processing for calculating the charging amount in the first embodiment and correcting the charging amount in the next charging with the calculated amount and a target charging amount.

The piezo actuator drive circuit 1, which includes the arithmetic means and the driving control means, calculates the energy as the charging amount and correctively controls, with the calculated amount and the target charging amount, the energy with which the piezo stack 7 is charged for the next time. This control processing will be described below with reference to FIG. 4.

At the first step S601 of the control processing, the driving control circuit 19 outputs a reset signal to turn on the fourth switching device 34, so that the integrated value of the integrating circuit 30 is reset and initialized. Subsequently, the fourth switching device 34 is turned off again, so that the integrating circuit 30 is ready for integration. Then, the step S601 is followed by the step S602.

At the step S602, if an injection signal Si as a driving signal rises to signal level 1, the charging time signal level becomes level 1 (Tt). At the same time, the driving control circuit 19 turns on the first switching device 14 (FIG. 5(*a*) through (*c*)), so that a charging current flows from the buffer capacitor 13 of the DC power supply 10 through the circuit including the first current-carrying path 12a of the first switching device 14, the inductor 16 and the piezo stack 7, and the current sensing resistor 18. The inductor 16 functions to increase the charging current with time.

The integrating circuit 30 of the arithmetic circuit 19a calculates the energy (FIG. 5(h)) that is the result of the time quadrature of the product of the charging voltage Vp (FIG. 5(d)) and the charging current I (FIG. 5(e)) flowing through the piezo stack 7 until the charging time Tt passes. That is, the charging voltage, which is the voltage applied across the piezo stack 7, is input through the buffer circuit 20 to the VCO circuit 21. The VCO circuit 21 outputs pulses (FIG. 5(f)) having a frequency (a period (v) proportional to the input voltage value. The output pulses are input to the one-shot circuit 22, which converts their width into a constant width Ti (FIG. 5(g)) when the output pulses rise.

The pulses from the one-shot circuit 22 turn on and off the third switching device 26, to which the charging current value sensed by the current sensing resistor 18 is input through the amplifier circuit 25. While the third switching device 26 is on, the output from the amplifier circuit 25 is input to the integrating circuit 30. The integrating circuit 30 outputs an operation result equivalent to the energy (FIG. 5(j)) as the result of the time quadrature of the power (FIG. 5(i)) that is the product of the charging voltage and current of the piezo stack 7. The energy calculated by the integrating circuit 30 is input to the A/D converter circuit 194 of the driving control circuit 19.

The next step S603 is to determine whether a preset ON period Ton has passed or not. If it is determined that the ON period Ton has passed, this step is followed by the step S604. If it is determined that the ON period Ton has not passed, the processing returns to the step S602, where the first switching device 14 is kept ON.

At the step S604, the driving control circuit 19 turns off the first switching device 14 (FIG. 5(c)). Then, the inductor 16 causes the charging current to keep flowing from it through the second current-carrying circuit 12b of the piezo stack 7 and the circuit of the current sensing resistor 18 and the second parasitic diode 151, bypassing the DC power supply 10 and the first switching device 14, and gradually decreases.

The next step S605 is to determine whether the charging time Tt has passed or not. If it is determined that the charging time Tt has passed, this step is followed by the step S607. If it is determined that the charging time Tt has not passed, the step S605 is followed by the step S606.

The step S606 is to continue the charging process. Specifically, this step is to determine whether the charging current value, which is decreasing gradually after the first switching device 14 is turned off at the step S604, has become 0 or not. If the charging current value is not 0, the step S606 is followed by no other control processing. That is, the step S606 is repeated. When the charging current value becomes 0, the processing returns to the step S602, where the first switching device 14 is turned on again.

Until the charging time Tt passes thereafter, the first switching device 14 is turned on and off repeatedly, keeping the piezo stack 7 charged.

At the step S607, because the predetermined charging time Tt has become level 0, so that the piezo stack 7 has been charged for the time Tt, the driving control circuit 19 terminates the charging. The step S607 is to compare the amount of energy that is the operation result input to the A/D converter circuit 194 of the driving control circuit 19, and the energy control signal value, which is the voltage value of the energy control signal Se, as the target amount of energy, and to find the difference between the compared amounts. That is, it is determined whether the amount of energy with which the piezo stack 7 is charged is larger or not than the energy control signal value. If it is determined that the amount of energy is larger than the energy control signal value, this step is followed by the step S608. If it is determined that the amount of energy is smaller than the energy control signal value, this step is followed by the step S609.

The step S608 is to set the next ON period Ton shorter by an ON period correction value ΔTon for the first switching device 14, which is preset in the driving control circuit 19 according to the difference found at the step S607, so as to decrease the energy with which the piezo stack 7 is charged during the next charging process. Then, the step S608 is followed by the step S610.

The step S609 is to set the ON period Ton longer by an ON period correction value ΔTon for the first switching device 14, which is preset in the driving control circuit 19 according to the difference found at the step S607, so as to increase the energy with which the piezo stack 7 is charged during the next charging process. Then, the step S609 is followed by the step S610.

The step S610 is to, when some time has passed after the step S608 or S609 ends, turn on the fourth switching device 34 of the integrating circuit 30 so as to discharge the integrating capacitor 33, reset the integration result and subsequently turn off this switching device 34 again for the next charging process.

The conventional multi-switching system charges the piezo stack 7 while repeatedly turning on and off the first switching device 14 for a constant charging time during a charging process. By presetting the ON period at the constant length Ton, the conventional system reduces the influence of the capacitance change of the piezo stack 7 with temperature, so that the energy with which the stack is charged can be roughly constant.

By contrast, in this embodiment, the arithmetic circuit 19a calculates the energy with which the piezo stack 7 is charged during the charging process. The calculated amount of energy and the target amount of energy are compared. The energy is corrected according to the difference between the compared amounts so that the energy with which the piezo stack 7 is charged for the preset constant charging time can be accurately controlled to be the constant target amount of energy.

Even if the amount of energy for the same amount of displacement changes due to the variation among piezo stacks, it is possible to accurately control the energy by setting various target amounts and correcting it according to the set amounts.

The correcting method according to this embodiment makes it possible to correct the peak value Ip of the charging current during one ON-OFF cycle by reconsidering the predetermined length Ton of the ON periods during the next charging process. Consequently, the energy with which the piezo stack 7 is charged for the next time can match with the target amount of energy by increasing or decreasing.

Second Embodiment

Figure 6:
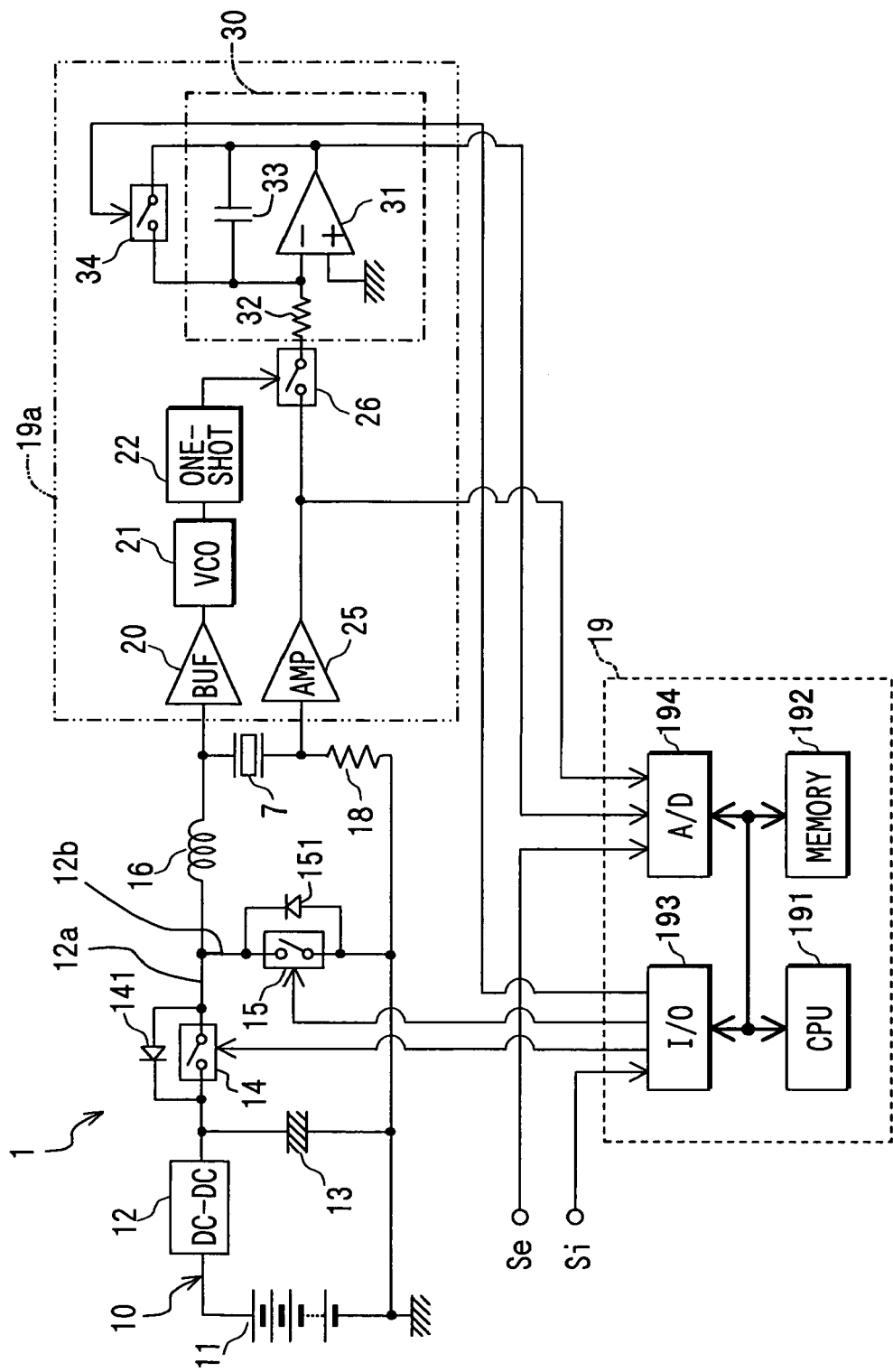
FIG. 6 is an electric circuit diagram of a piezo actuator drive circuit according to a second embodiment of the present invention.

The second embodiment shown in FIG. 6 is different from the first embodiment as follows.

A junction between the amplifier 25 and the third switching device 26 is connected with the A/D converter circuit 194 of the driving control circuit 19.

The charging current value, which is output from the current sensing resistor 18, is amplified by the amplifier circuit 25. The amplified current value is input through the third switching device 26 to the integrating circuit 30, as is the case with the first embodiment, and also input to the A/D converter circuit 194 of the driving control circuit 19. This makes it possible to determine the constant length Ton of the first ON period measured according to a preset current value, which is the peak value Ip of the charging current. During the subsequent predetermined charging period, the switching device 14 can be turned on and off repeatedly on the basis of the measured ON period Ton.

The method for comparing the amount of energy with which the piezo stack 7 is charged during a charging process and a target value, and for correcting the amount of energy according to the difference between the compared amount and value may include correcting the peak value Ip of the charging current in one ON-OFF cycle during the next charging process. In this case, the reconsideration of the peak current value Ip to be a value corrected from the preset current value leads to the correction of the constant length of the ON period, which is the result of the measurement during the next charging process. Consequently, as is the case with the first embodiment, the energy with which the piezo stack 7 is charged for the constant time can be accurately controlled to be the target amount.

Figure 7:
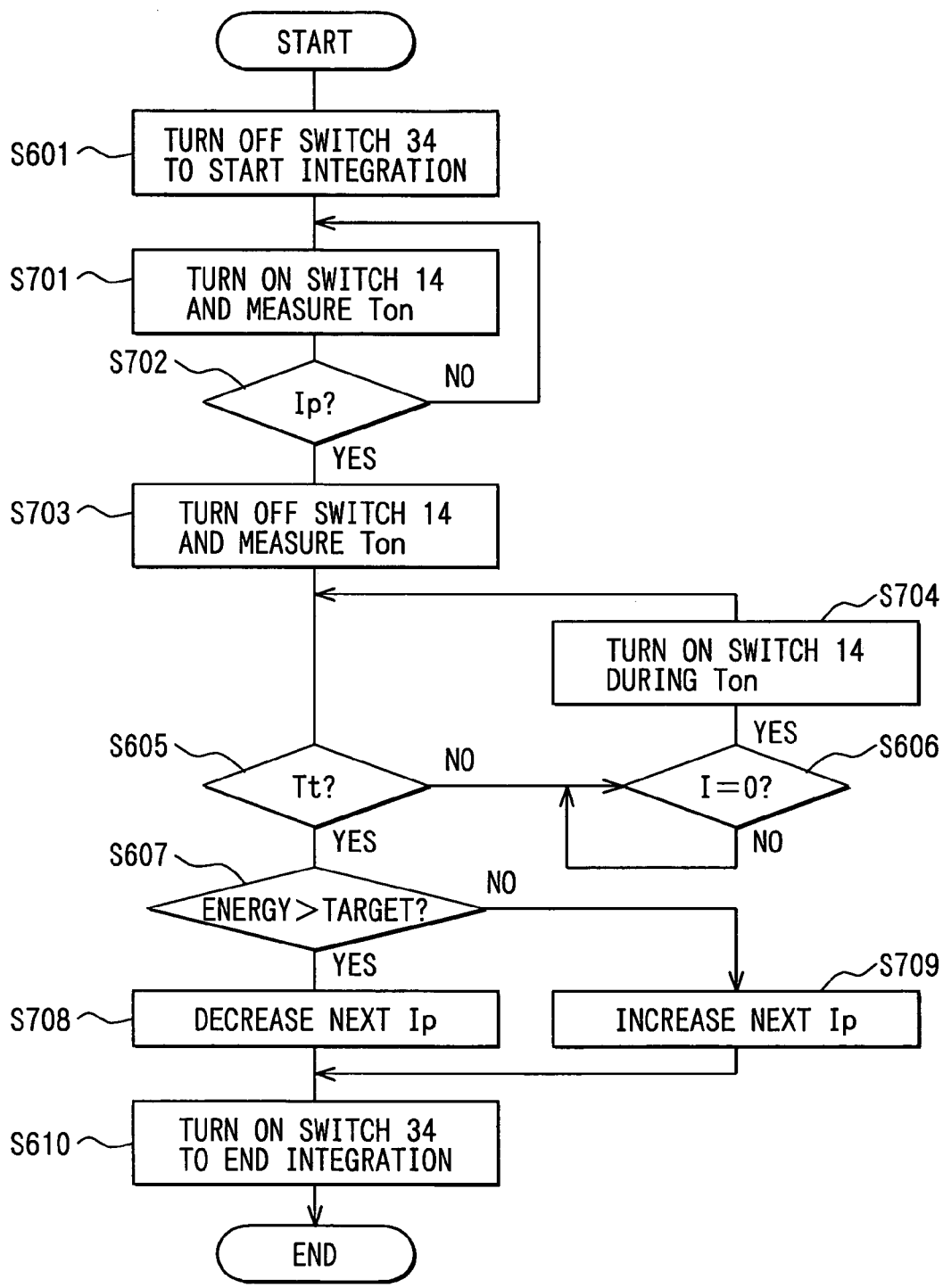
FIG. 7 is a flow chart showing the control processing for calculating the charging amount and correcting the charging amount in the next charging with the calculated amount and a target charging amount in the second embodiment.

FIG. 7 shows the control processing for calculating the energy as the charging amount in the piezo actuator drive circuit 1 according to the second embodiment and correctively controlling, from the calculated energy and the target energy, the energy with which the piezo stack 7 is charged for the next time. The steps S601, S605–S607 and S610 in FIG. 7 are identical with those of the first embodiment and will not be explained below.

The step S601 is followed by the step S701, where, if an injection signal Si as a driving signal rises to level 1, the driving control circuit 19 turns on the first switching device 14, as is the case with the first embodiment. This causes a charging current to flow from the buffer capacitor 13 of the DC power supply 10 through the circuit including the first current-carrying path 12a of the first switching device 14, the inductor 16 and the piezo stack 7, and the current sensing resistor 18. At the same time, the measurement of the ON period Ton is started. The inductor 16 functions to increase the charging current with time.

The next step S702 is to determine whether the preset peak value IP of the charging current has been reached by the charging current I increasing gradually after the first switching device 14 is turned on at the step S701. If it is determined that the gradually increasing charging current value has not reached the peak value Ip, the processing returns to the step S701, where the first switching device 14 is kept ON and the measurement of ON period is continued. If it is determined that this current value has reached the peak value Ip, the step S702 is followed by the step S703.

The step S703 is to turn off the first switching device 14 as soon as it is determined at the step S702 that the charging current value has reached the peak value Ip, and to store the result of the measurement of the ON period Ton in the memory 192 of the driving control circuit 19.

After the first switching device 14 is turned off at the step S703, the inductor 16 functions to gradually decrease the charging current. If it is determined at the next step S605 that the charging time Tt has not passed, the charging process is continued and this step S605 is followed by the step S606.

If the step S606 detects that the gradually decreasing charging current value becomes 0, this step is immediately followed by the step S704.

The step S704 is to turn on the first switching device 14 as soon as the charging current value becomes 0, thereby turning on and off the first switching device 14 repeatedly to keep the piezo stack 7 charged until the charging time Tt passes. If it is determined at the step S605 that the charging time Tt has passed, this step is followed by the step S607, as is the case with the first embodiment. The step S607 is to determine whether the amount of energy with which the piezo stack 7 is charged is larger or not than an energy control signal value.

If it is determined at the step S607 that the amount of energy is larger than the energy control signal value, this step is followed by the step S708. The step S708 is to set the peak current value Ip lower by a correction value for this peak value, which is preset in the driving control circuit 19 according to the difference between the amount of energy and the energy control signal value. This shortens the ON period Ton, thereby decreasing the amount of energy with which the piezo stack 7 is charged during the next charging process. Then, the step S708 is followed by the step S610. If it is determined at the step S607 that the amount of energy is smaller than the energy control signal value, this step is followed by the step S709. The step S709 is to set the peak current value Ip higher by a correction value for this peak value, which is preset in the driving control circuit 19 according to the difference between the amount of energy and the energy control signal value. This lengthen the ON period Ton, thereby increasing the energy with which the piezo stack 7 is charged during the next charging process Then, the step S709 is followed by the step S610.

Third Embodiment

Figure 8:
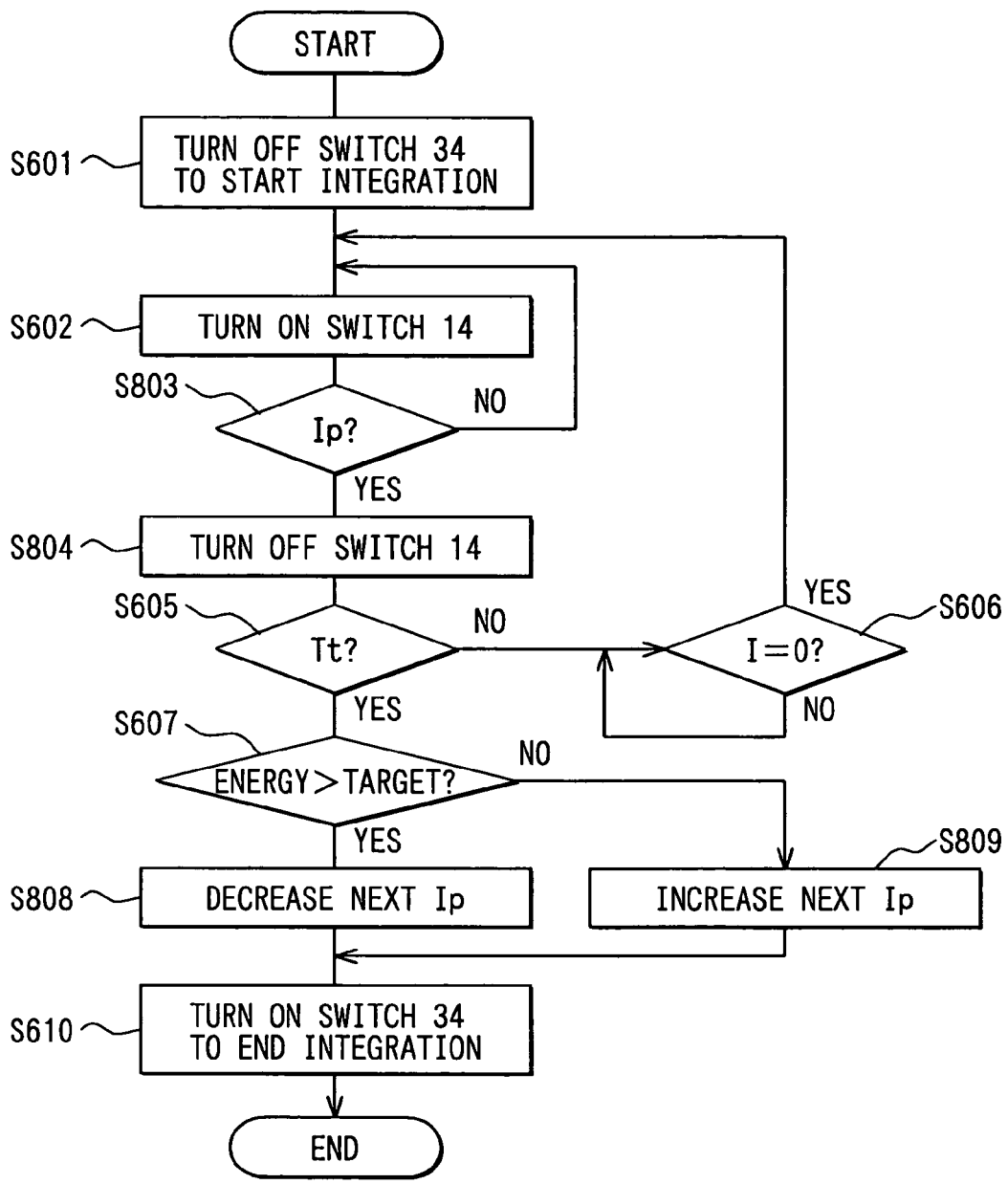
FIG. 8 is a flow chart showing the control processing for calculating the charging amount in a third embodiment of the present invention and correcting the charging amount in the next charging with the calculated amount and a target charging amount.

In the second embodiment, the preset peak value Ip of the charging current is used for the measurement of the length Ton of the first ON period. On the basis of the ON period Ton, the first switching device 14 is turned on and off repeatedly. In the third embodiment of the present invention, as shown in FIG. 8, the first switching device 14 is turned on or off on the basis of a preset peak value Ip of the charging current during a charging period. The electric circuitry of a piezo actuator drive circuit 1 according to the third embodiment is also constructed as shown in FIG. 6.

Figure 9:
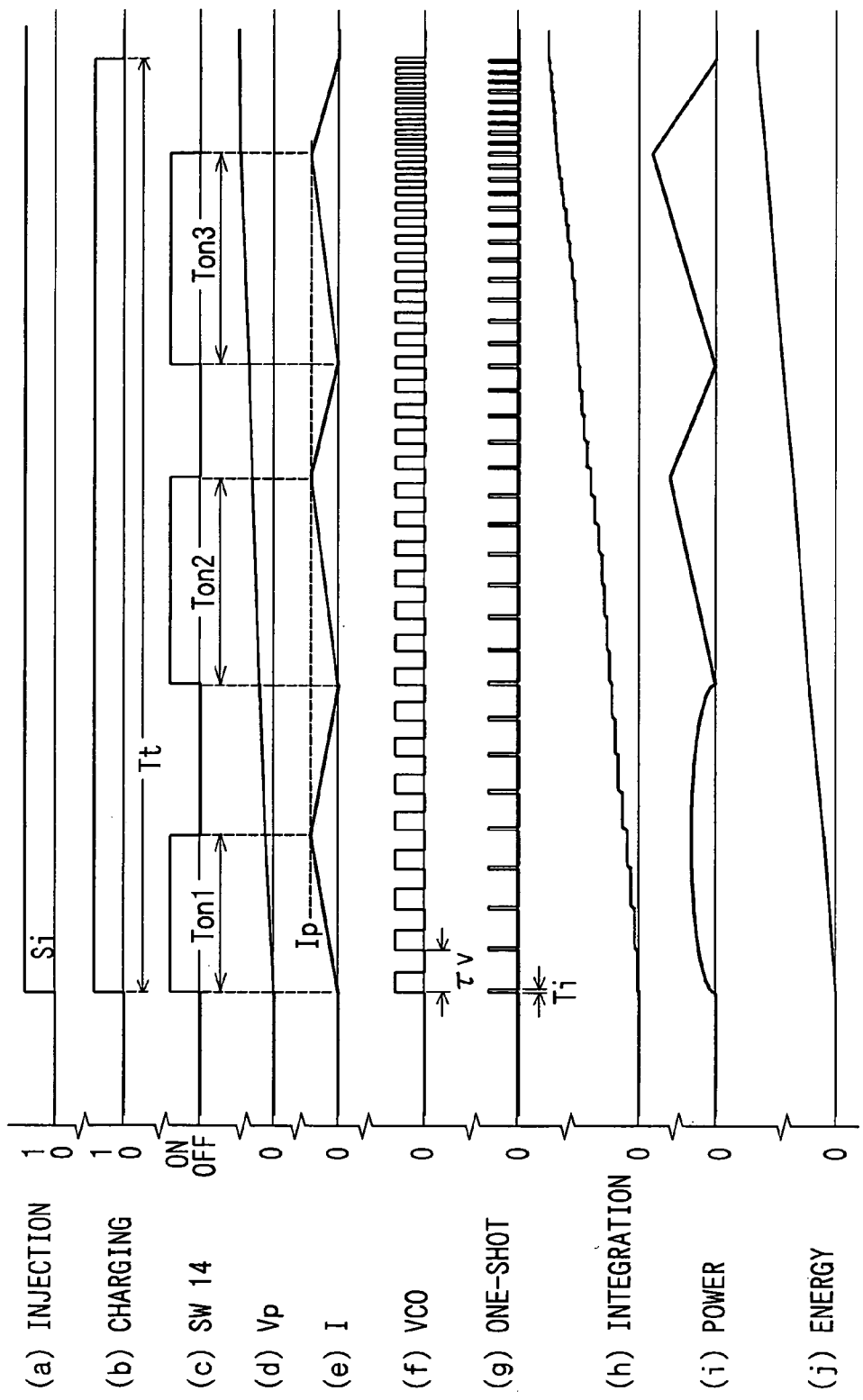
FIG. 9 is a time chart showing the operation of various parts of the piezo actuator drive circuit according to the third embodiment.
Figure 10:
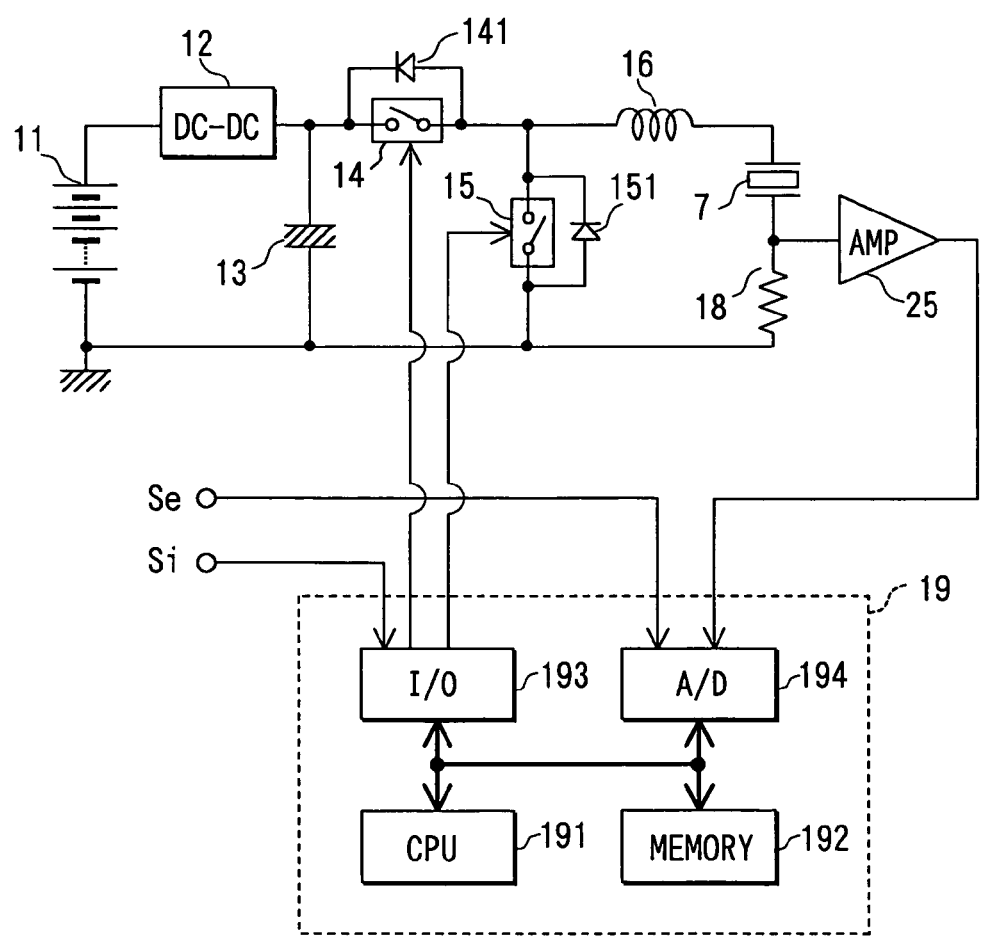
FIG. 10 is an electric circuit diagram of a conventional piezo actuator drive circuit.
Figure 11A:
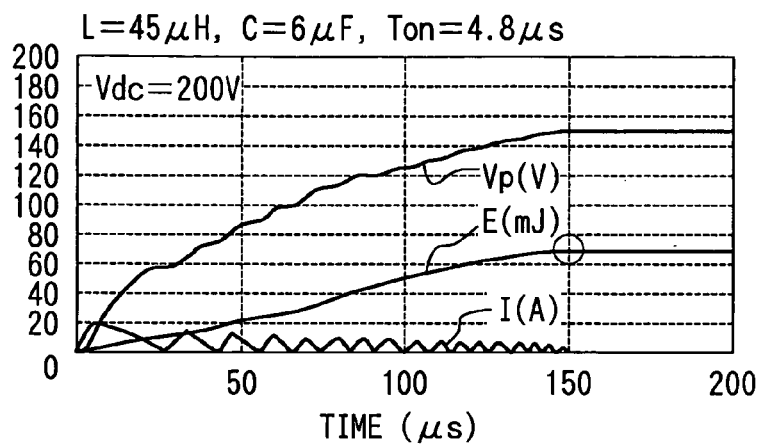
FIGS. 11A, 11B and 11C are graphs showing the operation of the conventional drive circuit for different capacitances of the piezo stack of the piezo actuator.
Figure 11B:
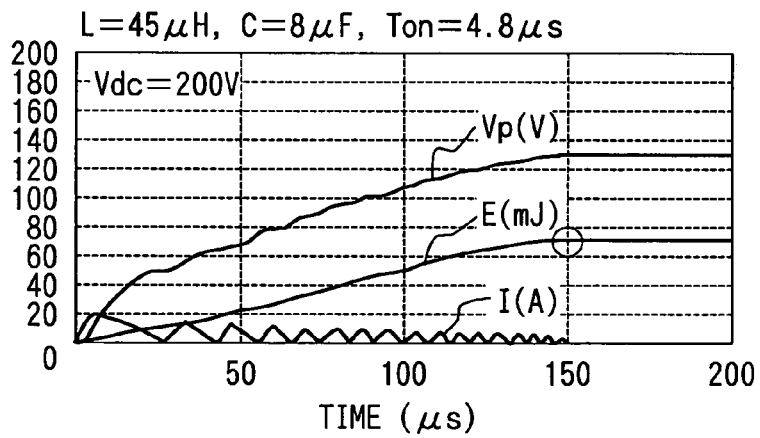
Figure 11C:
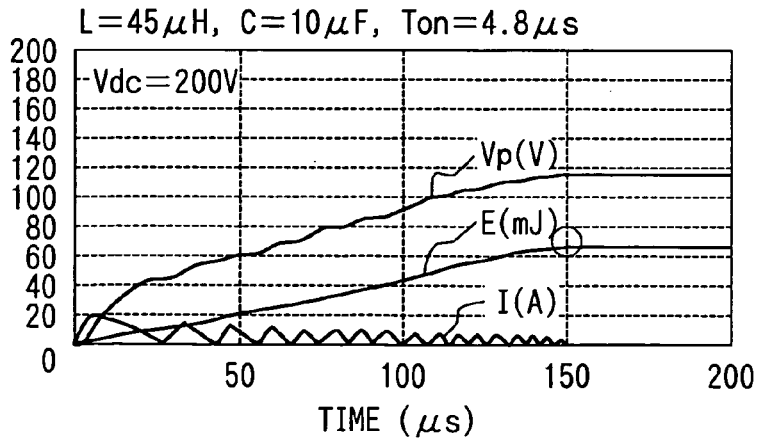

The time chart of FIG. 9 shows:
(a) an injection signal Si as a driving signal;
(b) a charging time Tt;
(c) the ON-OFF characteristic of the first switching device 14;
(d) the charging voltage applied to the piezo stack 7;
(e) the charging current I flowing through the piezo stack 7;
(f) the output characteristic of the VCO circuit 21;
(g) pulses output from the one-shot circuit 22; and
(h) the output characteristic of the integrating circuit 30.

FIG. 8 shows the control processing for calculating the energy as the charging amount in the piezo actuator drive circuit 1 according to the third embodiment. It also correctively controls, from the calculated energy and the target energy, the energy with which the piezo stack 7 is charged for the next time. The steps S601, S602, S605–S607 and S610 in FIG. 8 are identical with those of the first embodiment and will not be explained below.

The step S601 is followed by the step S602, where, if an injection signal Si as a driving signal rises to level 1, the driving control circuit 19 turns on the first switching device 14, as is the case with the first embodiment.

The next step S803 is to determine whether the preset peak value IP of the charging current has been reached by the charging current increasing gradually after the first switching device 14 is turned on at the step S602. If it is determined that the gradually increasing charging current value has not reached the peak value Ip, the processing returns to the step S602, where the first switching device 14 is kept ON. If it is determined that this current value has reached the peak value Ip, the step S803 is followed by the step S804, where the driving control circuit 19 turns off the first switching device 14.

After the first switching device 14 is turned off at the step S804, the inductor 16 functions to gradually decrease the charging current. If it is determined at the next step S605 that a charging time Tt has not passed, the charging process is continued, and this step S605 is followed by the step S606. If the gradually decreasing charging current value becomes 0 at the step S606, this step is immediately followed by the step S602, where the first switching device 14 is turned on again.

Until the charging time Tt passes thereafter, the first switching device 14 is turned on and off repeatedly, so that the piezo stack 7 is kept charged. Because the driving control circuit 19 turns on and off the first switching device 14 on the basis of the preset peak value Ip of the charging current during the charging period Tt, the peak value Ip is constant during the charging period (FIG. 9(e)). The ON periods Ton shown at (c) in FIG. 9 include the first ON period Ton1, second ON period Ton2 and third ON period Ton3. The relationship among the three ON periods is Ton1<Ton2<Ton3.

If it is determined at the step S605 that the charging time Tt has passed, this step is followed by the step S607, as is the case with the first embodiment. The step S607 is to determine whether the amount of energy with which the piezo stack 7 is charged is larger or not than an energy control signal value.

If it is determined at the step S607 that the amount of energy is larger than the energy control signal value, this step is followed by the step S808. The step S808 is to set the peak current value Ip lower by a correction value for this peak value, which is preset in the driving control circuit 19 according to the difference between the amount of energy and the energy control signal value. This decreases the amount of energy with which the piezo stack 7 is charged during the next charging process. Then, the step S808 is followed by the step S610. If it is determined at the step S607 that the amount of energy is smaller than the energy control signal value, this step is followed by the step S809.

The step S809 is to set the peak current value Ip higher by a correction value for this peak value, which is preset in the driving control circuit 19 according to the difference between the amount of energy and the energy control signal value. This increases the energy with which the piezo stack 7 is charged during the next charging process. Then, the step S808 is followed by the step S610.

The method according to each of the three embodiments for comparing the amount of energy with which the piezo stack 7 is charged during a charging process and a target value, and for correcting the amount of energy according to the difference between the compared amount and value includes reconsidering the peak value Ip of the charging current in one ON-OFF cycle during the next charging process to be a value corrected from a set current value. Accordingly, the amount of energy with which the piezo stack 7 is charged during a preset constant charging time Tt can be accurately controlled to be a constant target energy value.

The above embodiments may be modified or altered without departing from the scope and spirit of the invention.

What is claimed is:

1. A piezo actuator drive circuit comprising:
   a charging means for charging during a predetermined charging period a piezo stack that can be driven by being charged and discharged;
   an arithmetic means for calculating a charging amount in which the charging means charges the piezo stack during the charging period; and
   a driving control means for comparing the calculated charging amount and a target charging amount and correcting the charging amount during a next charging process according to a difference between the compared charging amounts;
   wherein a charging current flowing through the piezo stack and a charging voltage applied to the piezo stack are measured during a charging process, the calculated charging amount being an amount of energy that is a result of a time quadrature of a product of the measured current and voltage; and
   the arithmetic means integrates the charging current at every integration period variable with the charging voltage to calculate the charging amount.

2. The piezo actuator drive circuit according to claim 1, wherein:
   the charging means is a multiple switching system;
   the charging means includes a first current-carrying path for carrying current from a DC power supply through an inductor to the piezo stack, the first current-carrying path fitted with a switching device for repeating ON and OFF states;
   the charging means allows a gradually increasing charging current to flow through the first current-carrying path during an ON period when the switching device is ON;
   the charging means further includes a second current-carrying path for carrying current from the inductor through the piezo stack, bypassing the DC power supply and the switching device;
   the charging means further allows a gradually decreasing charging current to flow due to the flywheel effect through the second current-carrying path during an OFF period when the switching device is OFF;
   the driving control means is adapted to perform ON-OFF control of the switching device with a predetermined ON period (Ton) during the charging period; and
   the driving control means is further adapted to correct the length of the ON period according to the difference between the compared amounts.

3. The piezo actuator drive circuit according to claim 2, wherein the predetermined ON period is based on the target charging amount.

4. The piezo actuator drive circuit according to claim 2, further comprising:
   a current sensing means for sensing the charging current flowing through the piezo stack when the switching device changes over from an ON state to an OFF state,
   wherein the driving control means is further adapted to cause the ON period of at least the first charging process during the charging period to end when the sensed charging current reaches a preset current value, and the driving control means is further adapted to correct the preset current value according to the difference between the compared amounts during the next charging process.

5. The piezo actuator drive circuit according to claim 1, wherein the integration period is shorter than the charging period.

6. The piezo actuator drive circuit according to claim 1, wherein the integration period is made shorter as the charging voltage increases.

7. A method comprising:
charging during a predetermined charging period a piezo stack that can be driven by being charged and discharged;
calculating a charging amount in which the piezo stack is charged during the charging period;
comparing the calculated charging amount and a target charging amount; and
correcting the charging amount during a next charging process according to a difference between the compared charging amounts;
wherein a charging current flowing through the piezo stack and a charging voltage applied to the piezo stack are measured during a charging process, the calculated charging amount being an amount of energy that is a result of a time quadrature of a product of the measured current and voltage; and
the charging current is integrated at every integration period variable with the charging voltage to calculate the charging amount.

8. The method according to claim 7, further comprising:
carrying current in a first current-carrying path from a DC power supply through an inductor to the piezo stack, the first current-carrying path being fitted with a switching device for repeating ON and OFF states;
allowing a gradually increasing charging current to flow through the first current-carrying path during an ON period when the switching device is ON;
carrying current in a second current-carrying path from the inductor through the piezo stack, bypassing the DC power supply and the switching device;
allowing a gradually decreasing charging current to flow due to the flywheel effect through the second current-carrying path during an OFF period when the switching device is OFF;
performing ON-OFF control of the switching device with a predetermined ON period (Ton) during the charging period; and
correcting the length of the ON period according to the difference between the compared amounts.

9. The method according to claim 8, wherein the predetermined ON period is based on the target charging amount.

10. The method according to claim 9, further comprising:
sensing the charging current flowing through the piezo stack when the switching device changes over from an ON state to an OFF state;
causing the ON period of at least the first charging process during the charging period to end when the sensed charging current reaches a preset current value; and
correcting the preset current value according to the difference between the compared amounts during the next charging process.

11. The method according to claim 7, wherein the integration period is shorter than the charging period.

12. The method according to claim 7, wherein the integration period is made shorter as the charging voltage increases.

* * * * *